United States Patent
Lee et al.

(10) Patent No.: US 9,263,421 B2
(45) Date of Patent: Feb. 16, 2016

(54) SEMICONDUCTOR DEVICE HAVING MULTIPLE CHIPS MOUNTED TO A CARRIER

(71) Applicant: Infineon Technologies AG, Neubiberg (DE)

(72) Inventors: Boon Seong Lee, Melaka (MY); Chee Voon Tan, Seremban (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/193,897

(22) Filed: Feb. 28, 2014

(65) Prior Publication Data

US 2015/0249067 A1 Sep. 3, 2015

(51) Int. Cl.
*H01L 23/48* (2006.01)
*H01L 25/065* (2006.01)
*H01L 25/00* (2006.01)

(52) U.S. Cl.
CPC ............ *H01L 25/0657* (2013.01); *H01L 25/50* (2013.01); *H01L 2224/0603* (2013.01); *H01L 2224/48247* (2013.01); *H01L 2224/49111* (2013.01); *H01L 2224/49171* (2013.01); *H01L 2224/49175* (2013.01); *H01L 2225/0651* (2013.01); *H01L 2225/06562* (2013.01)

(58) Field of Classification Search
CPC ............ H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/18; H01L 25/105; H01L 25/0657
USPC .......................................... 257/777, 686, 685
See application file for complete search history.

(56) References Cited

U.S. PATENT DOCUMENTS

| | | | |
|---|---|---|---|
| 6,137,165 A | 10/2000 | Thierry | |
| 7,898,092 B2 | 3/2011 | Lu et al. | |
| 2009/0128968 A1 | 5/2009 | Lu et al. | |
| 2014/0175660 A1* | 6/2014 | Lee | ............ H01L 25/0657 257/773 |
| 2014/0191417 A1* | 7/2014 | Tan | .................. H01L 25/50 257/777 |

* cited by examiner

*Primary Examiner* — Hoa B Trinh
(74) *Attorney, Agent, or Firm* — Murphy, Bilak & Homiller, PLLC (57) ABSTRACT

A semiconductor device includes a chip carrier having a first surface and a second surface opposite to the first surface. The device further includes a first semiconductor chip mounted on the first surface of the chip carrier. A second semiconductor chip is mounted on the second surface of the chip carrier, wherein a portion of a first surface of the second semiconductor chip which faces the chip carrier projects over an edge of the chip carrier. A first electrical conductor is coupled to an electrode formed on the portion of the first surface of the second semiconductor chip that projects over the edge of the chip carrier.

17 Claims, 7 Drawing Sheets

SEMICONDUCTOR DEVICE HAVING MULTIPLE CHIPS MOUNTED TO A CARRIER

TECHNICAL FIELD

This invention relates generally to the technique of semiconductor device packaging, and in particular to the technique of packaging multiple semiconductor chips mounted to a carrier.

BACKGROUND

Semiconductor device manufacturers are constantly striving to increase the performance of their products, while decreasing their cost of manufacture. A cost intensive area in the manufacture of semiconductor device packages is packaging the semiconductor chip. Thus, semiconductor device packages and methods of manufacturing the same at low expenses and high yield are desirable. In particular, the performance of power semiconductor device packages is dependent from the heat dissipation capability provided by the package. Packaging methods of power devices providing high thermal robustness at low expenses and improved reliability are desirable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Devices containing two or more semiconductor chips are, inter alia, described herein. In particular, one or more power semiconductor chips may be involved. Power Semiconductor chips may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g. a PIN diode or a Schottky diode.

The semiconductor devices described herein may include one or more logic integrated circuits to control the power semiconductor chip(s). The logic integrated circuit may include one or more driver circuits to drive one or more of the power semiconductor chips. The logic integrated circuit may, e.g., be a microcontroller including, e.g., memory circuits, level shifters, etc.

Power semiconductor chip(s) may, e.g., have a vertical structure, that is to say that the semiconductor chip(s) may be fabricated in such a way that electric currents can flow in a direction perpendicular to the main surfaces of the semiconductor chip(s). A semiconductor chip having a vertical structure has electrodes on its two main surfaces, that is to say on its top side and bottom side. By way of example, in vertical devices, the source contact electrode and the gate contact electrode of a power MISFET or a power MOSFET or a HEMT may be situated on one main surface, while the drain contact electrode of the power MISFET or power MOSFET or power HEMT may be arranged on the other main surface. In case of a power diode, the anode contact electrode may be situated on one main surface, while the cathode contact electrode of the power diode may be arranged on the other main surface.

Devices containing semiconductor chip(s) having a horizontal structure may be involved. A semiconductor chip having a horizontal structure has chip electrodes only on one of its two main surfaces, e.g. on its active surface. Logic integrated circuit chips as well as power semiconductor chips (e.g. power MISFET or power MOSFET or power HEMT) may have a horizontal structure.

The semiconductor chips may be manufactured from specific semiconductor material such as, for example, Si, SiC, SiGe, GaAs, GaN, etc., and, furthermore, may contain inorganic and/or organic materials that are not semiconductors. The semiconductor chips may be of different types and may be manufactured by different technologies.

The semiconductor chips may have electrodes (chip pads) which allow electrical contact to be made with the integrated circuits included in the semiconductor chips. The electrodes may include one or more metal layers which are applied to the semiconductor material of the semiconductor chips. The metal layers may be manufactured with any desired geometric shape and any desired material composition. The metal layers may, for example, be in the form of a layer or land covering an area. By way of example, any desired metal capable of forming a solder bond or a diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

Two or more semiconductor chips are mounted to a chip carrier. In one embodiment, the chip carrier may comprise multiple metal plates such as, e.g., one or more die pads and/or terminal pads of, e.g., a leadframe. The die pad(s) may serve as chip carrier(s), e.g. chip pad(s). The metal plates may be made of any metal or metal alloy, e.g. copper or copper alloy. By way of example, such chip carrier may be a leadless chip carrier such as, e.g., a so-called TSLP—(Thin Small Leadless Package-) carrier. The chip carrier may also be a leaded chip carrier having leads protruding out of an encapsulant and forming external terminals. By way of example, such leaded chip carrier may be a PLCC (Plastic Leaded Chip Carrier) or QFJ (Quad-Flat-J-Leaded) chip carrier. It is also possible that the chip carrier may comprise or be a PCB (printed circuit board). In other embodiments, the chip carrier may comprise a plate of ceramics coated with a structured metal layer, e.g. a metal bonded ceramics substrate. By way of example, the chip carrier may be a DCB (direct copper bonded) ceramics substrate.

The chip carrier and the two or more semiconductor chips may at least partly be surrounded or embedded in at least one encapsulating material forming an encapsulant. The encapsulating material may be an electrically insulating material and may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may comprise or be a polymer material, e.g. a duroplastic polymer material. The encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material may be applied over the two or more semiconductor chips and, e.g., the chip carrier by, e.g., molding or laminating.

In the first case, i.e. if the encapsulating material is a mold material, various techniques such as, e.g., compression molding, injection molding, powder molding, liquid molding, or film-assisted molding (FAM) may be used to form an encapsulant or an encapsulation body containing a plurality of encapsulants. The mold material may be applied to overmold the semiconductor chips and the chip carrier on which the semiconductor chips may be mounted. Bottom chip electrodes of one or more semiconductor chip(s) mounted beneath the chip carrier may, e.g., remain exposed and may serve as outer terminals of the semiconductor device (i.e. as package terminals).

In the second case, i.e. if the encapsulating material is made of a laminate material, the encapsulating material may have the shape of a piece of a layer, e.g. a piece of a sheet or foil that is laminated over the semiconductor chips and over the chip carrier on which the semiconductor chips are mounted. Heat and pressure may be applied for a time suitable to attach the piece of a foil or sheet to the underlying structure. During lamination, the electrically insulating foil or sheet is capable of flowing (i.e. is in a plastic state), resulting in that gaps between the semiconductor chips and/or other topological structures are filled with the polymer material of the electrically insulating foil or sheet. The electrically insulating foil or sheet may comprise or be any appropriate thermoplastic or thermoset material. In various embodiments, the insulating foil or sheet may comprise or be a prepreg (short for pre-impregnated fibers), that is e.g. made of a combination of a fiber mat, for example glass or carbon fibers, and a resin, for example a thermoset or thermoplastic material. Prepreg materials are typically used to manufacture PCBs (printed circuit boards). Again, also for laminate packages, bottom chip electrodes of one or more semiconductor chip(s) mounted beneath the chip carrier may, e.g., remain exposed and may serve as outer terminals of the semiconductor device (i.e. as package terminals).

A variety of different types of semiconductor devices may be designed in accordance with the disclosure herein. By way of example, a semiconductor device may constitute a power supply containing two or more power semiconductor chips, e.g. MOSFETs, MOSFETs, or HEMTs, and one or more logic integrated circuits. For instance, a semiconductor device disclosed herein may comprise a half-bridge circuit including a high side transistor, a low side transistor and a logic integrated circuit chip. The logic integrated circuit chip may, optionally, include one or a plurality of transistor driver circuitry.

A half-bridge circuit as disclosed herein may, e.g., be implemented in an electronic circuit for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. By way of example, a DC-DC converter described herein may be a buck converter or down-converter. AC-DC converters may be used to convert an AC input voltage provided by, e.g., a high voltage AC power network into a DC output voltage matched to the demands of electronic circuits connected downstream.

Figure 1:
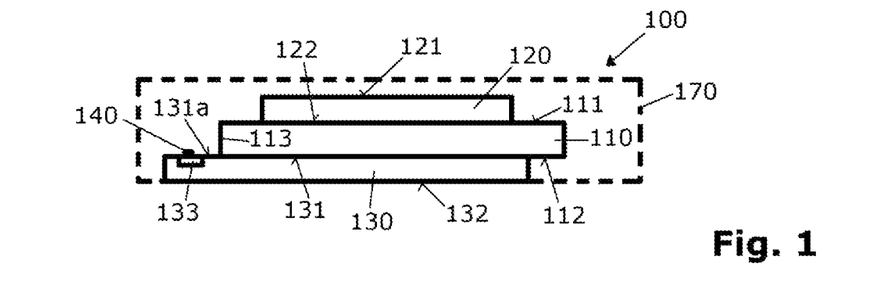
FIG. 1 schematically illustrates a cross-sectional view of an exemplary semiconductor device including at least two semiconductor chips mounted to opposite sides of a chip carrier.

FIG. 1 illustrates a cross-sectional view of an exemplary semiconductor device package 100. The semiconductor package 100 may comprise a chip carrier 110, a first semiconductor chip 120 mounted on a first (upper) surface 111 of the chip carrier 110 and a second semiconductor chip 130 mounted on a second (lower) surface 112 of the chip carrier 110. The first surface 111 and the second surface 112 of the chip carrier 110 are arranged opposite to one another. That is, while the first semiconductor chip 120 is mounted over the chip carrier 110, the second semiconductor chip 130 is mounted beneath the chip carrier 110. In general, if not expressively stated to the contrary herein, mounting of the first semiconductor chip 120 and/or the second semiconductor chip 130 (or any other semiconductor chip) on the chip carrier 110 may provide for an electrical connection of the chip carrier 110 to the respective semiconductor chip 120, 130 or may electrically insulate the respective semiconductor chip 120, 130 from the chip carrier 110.

The second semiconductor chip 130 may project in a lateral direction over an edge 113 of the chip carrier 110. That way, a portion 131a of a first surface 131 of the second semiconductor chip 130 which faces the chip carrier 110 projects over the edge 113 of the chip carrier 110 in a lateral direction. The portion 131a of the first surface 131 may not be covered by the chip carrier 110, whereas the residual portion of the first surface 131 of the second semiconductor chip 130 may completely or partly be covered by and/or mechanical fixed to the chip carrier 110, more specifically to the second surface 112 thereof.

The second semiconductor chip 130 may be electrically accessible at the projecting portion 131a of its first surface 131. A first electrical conductor 140 may be bonded to an electrode 133 formed on the portion 131a of the first surface 131 of the second semiconductor chip 130.

By way of example, the second semiconductor chip 130 may be a power semiconductor chip. A power semiconductor chip may, e.g., be configured as a power transistor, for example, a power MISFET, MOSFET, IGBT, JFET, HEMT, a power bipolar transistor, or a power diode. In case of a power MISFET, MOSFET or a JFET, a first load electrode is a source electrode, a second load electrode is a drain electrode, and a first electrode is a gate electrode. In the case of an IGBT, a first electrode is a gate electrode, a second electrode is an emitter electrode, and a third electrode is a collector electrode. In the case of a power bipolar transistor, a first electrode is a base electrode, a second electrode is an emitter electrode, and a third electrode is a collector electrode. In all these and other cases the electrode 133 may be the first electrode (i.e. the control electrode such as, e.g., the gate or base electrode) of the second semiconductor chip 130. The locations of the second and third electrodes may vary depending on the type and design of the second semiconductor chip 130. By way of example, the second electrode (e.g. source or emitter electrode) may be arranged at the first surface 131 of the second semiconductor chip 130 and may be mechanically and electrically connected to the second surface 112 of the chip carrier 110. The electrically conducting connection between the second electrode and the chip carrier 110 may be made by means of an electrically conducting bond layer (not shown) which may, e.g., comprise or consists of solder, a soft solder, a diffusion solder, an electrically conducting paste, a nanopaste, a sinter metal material, or an electrically conducting adhesive. The third electrode (e.g. drain or collector electrode) may either be situated at the second surface 132 of the second semiconductor chip 130 or may also be located at the first surface 131 of the second semiconductor chip 130 and may be electrically and mechanically connected to the chip carrier 110. In the latter case, i.e. if the second and third electrodes (i.e. the load electrodes) are located at the first surface 131 of the second semiconductor chip 130, the chip carrier 110 may be split into two chip pad zones separated by a slit formed between them. Otherwise, if the third electrode is arranged at the second surface 132 of the second semiconductor chip 130, the third electrode may serve as an external terminal of the semiconductor device package 100.

As to the second semiconductor chip 130, during operation, voltages higher than 5, 50, 100, 500, or 1000 V may be applied between the second and third electrodes. The switching frequency applied to the first electrode may e.g. be in the range from 1 kHz to 100 MHz, but may also be outside of this range.

The first and the second semiconductor chips 120, 130 and the chip carrier 110 may optionally be embedded partly or completely in an encapsulating material forming an encapsulant 170. The encapsulant 170 may, e.g., be a mold material or a laminate. The encapsulant 170 may e.g. completely cover the upper first surface 121 of the first semiconductor chip 120, the chip carrier 110, the projecting portion 131a of the first surface 131 and the side surfaces of the second semiconductor chip 130. However, the second surface 132 of the second semiconductor chip may be partly or completely be exposed by the encapsulant 170 so as to provide accessibility to a third electrode of the second semiconductor chip 130 at the second surface 132 thereof, if any.

Figure 2:
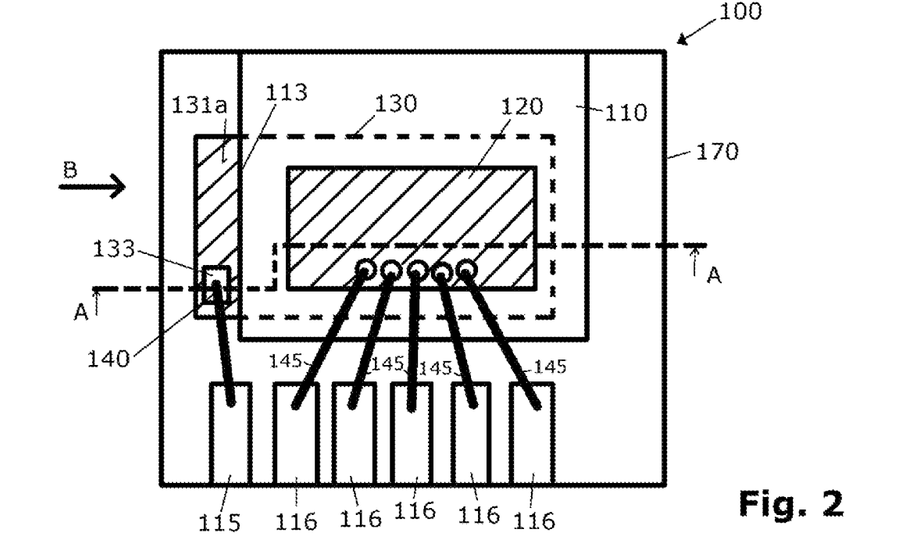
FIG. 2 schematically illustrates a top view of an exemplary semiconductor device including at least two semiconductor chips mounted to opposite sides of a chip carrier.

Referring to FIG. 2, a top view of a semiconductor device package such as, e.g., semiconductor device package 100 is depicted. The encapsulant 170 is not shown in order to illustrate the inner package design. It is to be noted that FIG. 1 could be interpreted as a sectional view along line A-A of FIG. 2. However, the semiconductor device package 100 illustrated in FIG. 1 may generally have a top view design different from the specific example shown in FIG. 2.

The semiconductor device package 100 may have a rectangular shape or outline. As illustrated in FIG. 2, the chip carrier 110 may be a chip pad of a device carrier (e.g. a leadframe), which further comprises terminal pads such as, e.g., a first terminal pad 115 and a plurality of second terminal pads 116. The first terminal pad 115 and the terminal pads 116 may serve as external terminals of the semiconductor device package 100.

The first electrical conductor 140 may be configured to couple the first electrode 133 of the second semiconductor chip 130 to the first terminal pad 115. Second electrical conductors 145 may be configured to couple the second terminal pads 116 to electrodes of the first semiconductor chip 120. By way of example, the electrodes on the first semiconductor chip 120 to which the second terminal pads 116 are coupled may, e.g., be I/O (input/output) electrodes or power supply electrodes. The first semiconductor chip 120 may, e.g., be a logic chip or driver chip configured to control a power semiconductor chip such as, e.g., the second semiconductor chip 130 or a further power semiconductor chip (not shown) incorporated in the semiconductor device package 100.

As illustrated in FIG. 2, the first semiconductor chip 120 may not project laterally beyond the edge 113 of the chip carrier 110. At least, the first semiconductor chip 110 may be placed on the chip carrier 110 in a position not to cover or overlap the first electrode 133 on the portion 131a of the first surface 131 of the second semiconductor chip 130. That way, the first electrode 133 remains accessible during a bonding process such as, e.g., a wire bonding process. This bonding process may include interconnecting the electrode 133 on the second semiconductor chip 130 with, e.g., the first terminal pad 115. It may further include interconnecting electrodes on the first semiconductor chip 120 with the second terminal pad 116.

Figure 3:
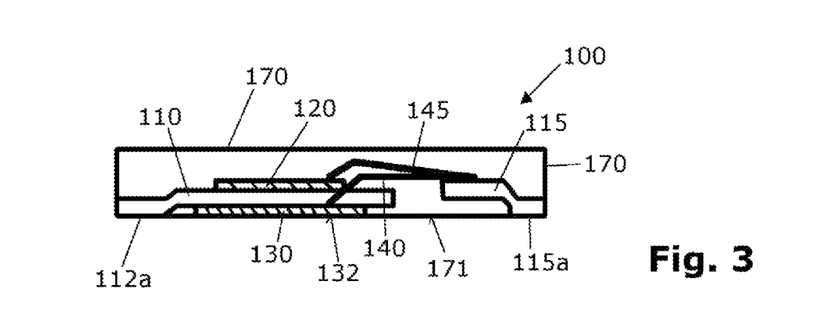
FIG. 3 schematically illustrates a side view from viewing direction B of FIG. 2 of an exemplary semiconductor device including at least two semiconductor chips mounted to opposite sides of a chip carrier.

Referring to FIG. 3, a side view from direction B of a semiconductor device package such as, e.g., package 100 of FIG. 2, is depicted. The encapsulant 170 is assumed to be transparent in this view.

The chip carrier 110 and/or the first and/or second terminal pads 115, 116 may have a stepped design and may provide for contact faces 112a, 115a of the chip carrier 110 and the first terminal pad 115, respectively, located at the bottom of the semiconductor device package 100. The contact faces 112a, 115a may serve as external terminals of the semiconductor device package 100. Further, as already mentioned, the second surface 132 of the second semiconductor chip 130 may be provided with a chip electrode (not shown) which may simultaneously serve as a package external terminal. In order to arrive at, e.g., a planar bottom surface 171 of the semiconductor device package 100, the step height of the chip carrier 110 may be about the same as the thickness of the second semiconductor chip 130 plus any bonding layer arranged between the second (lower) surface 112 of the chip carrier 110 and the first (upper) surface 131 of the second semiconductor chip 130.

The thickness of the chip carrier 110 between the first and second semiconductor chips 120, 130 may, e.g., be equal to or greater than 100 μm, 200 μm, 300 μm, 400 μm, and 500 μm and/or may, e.g. be equal to or less than 600 μm, 500 μm, 400 μm, 300 μm, and 200 μm. The thickness of the second semiconductor chip 130 may be equal to or less than 300 μm, 200 μm, and 100 μm. The second semiconductor chip 130 may have a chip area of about 1 to 10 mm times 1 to 10 mm.

By way of example, the first and second electrical conductors 140, 145 are wire bonds. To allow for a low loop profile of about 50 μm or less, a BSOB (bond stitch on ball) technology may be used. BSOB may, in particular, be used for the second electrical conductors 145 connecting to the first (upper) semiconductor chip 120. BSOB is a two-step one cycle process. The first is to form a stud ball bump on the surface on which the bonding wire connection is to be formed. The second step is a reverse bonding wherein the ball bond is bonded into the surface and a stitch bond formation is performed on top of the ball bump.

Figure 4:
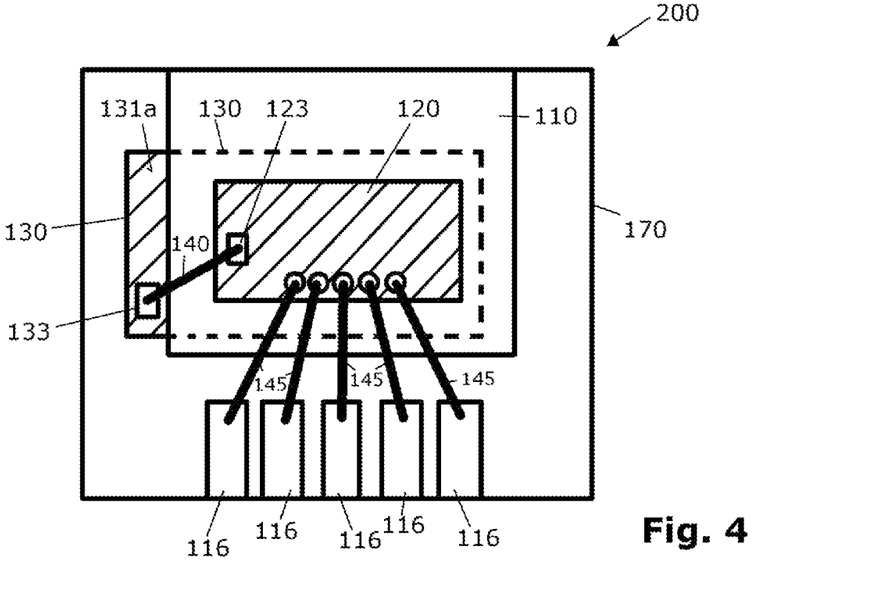
FIG. 4 schematically illustrates a top view of an exemplary semiconductor device including at least two semiconductor chips mounted to opposite sides of a chip carrier.

FIG. 4 illustrates a top view of a semiconductor device package 200. In semiconductor device package 200 the first electrical conductor 140 connecting to the first electrode 133 of the second semiconductor chip 130 is further coupled to a first electrode 123 of the first semiconductor chip 120. The first electrode 123 may be an I/O electrode or a driver signal output electrode of the first semiconductor chip 120. The first electrical conductor 140 may thus form a chip-to-chip interconnect. Again, the first electrical conductor 140 may be formed by a wire bonding process such as, e.g. BSOB. The first terminal pad 115 may be omitted or the semiconductor device package 200 may also provide with a first terminal pad 115 which is connected to the first electrode 133 of the second semiconductor chip 130 as shown in FIG. 2. In the latter case the voltage at the first electrode 133 of the second semiconductor chip 130 is accessible by external applications at the first terminal pad 115 (not shown) of the semiconductor device package 200. Apart from these features the semiconductor device package 200 may be identical to semiconductor device package 100 as depicted in FIGS. 1 to 3, and reference is made the above disclosure in order to avoid reiteration.

Figure 5:
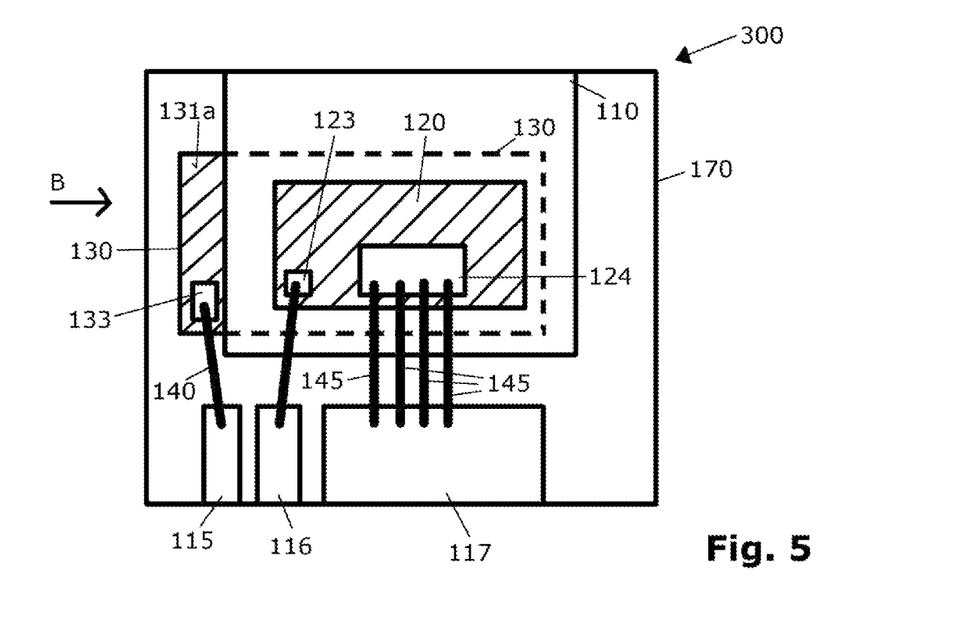
FIG. 5 schematically illustrates a top view of an exemplary semiconductor device including at least two semiconductor chips mounted to opposite sides of a chip carrier.

FIG. 5 illustrates a top view of a semiconductor device package 300. In semiconductor device package 300 the first semiconductor chip 120 may be a power semiconductor chip, e.g. a power semiconductor chip of any of the aforementioned types. A first electrode 123 of the first semiconductor chip 120, which may be a control electrode thereof, may be electrically connected to a second terminal pad 116. A second electrode 124 of the first semiconductor chip 120 may be connected by second electrical conductors 145 to a third terminal pad 117 of the semiconductor device package 300. The second electrode 124 of the first semiconductor chip 120 may be a load electrode, e.g. a source electrode of a MISFET or MOSFET. The second electrical conductors 145 may, e.g., be a plurality of wire bonds.

Apart from the above features the semiconductor device package 300 may be identical to semiconductor device packages 100 or 200, and reference is made to the above disclosure in order to avoid reiteration.

Generally, the first semiconductor chip 120 may be bonded to the chip carrier 110 by means of an electrically conducting bond layer (not shown) which may, e.g., comprise or consists of solder, a soft solder, a diffusion solder, an electrically conducting paste, a nanopaste, a sinter metal material, or an electrically conducting adhesive. In this case the chip carrier 110 may be electrically and mechanically connected to a load electrode (e.g. drain or collector electrode) of the first semiconductor chip 120. In other embodiments, if the first semiconductor chip 120 has a horizontal structure (i.e. does not have any electrode at the bottom second surface 122 thereof), the bond layer (not shown) between the chip carrier 110 and the second surface 122 of the first semiconductor chip 120 may, e.g., comprise or consist of a non-conducting material. This applies both for the implementations in which the first semiconductor chip 120 is a power semiconductor chip without bottom side electrode and the implementations in which the first semiconductor chip 120 is a logic chip or driver chip without bottom side electrode(s).

Figure 6:
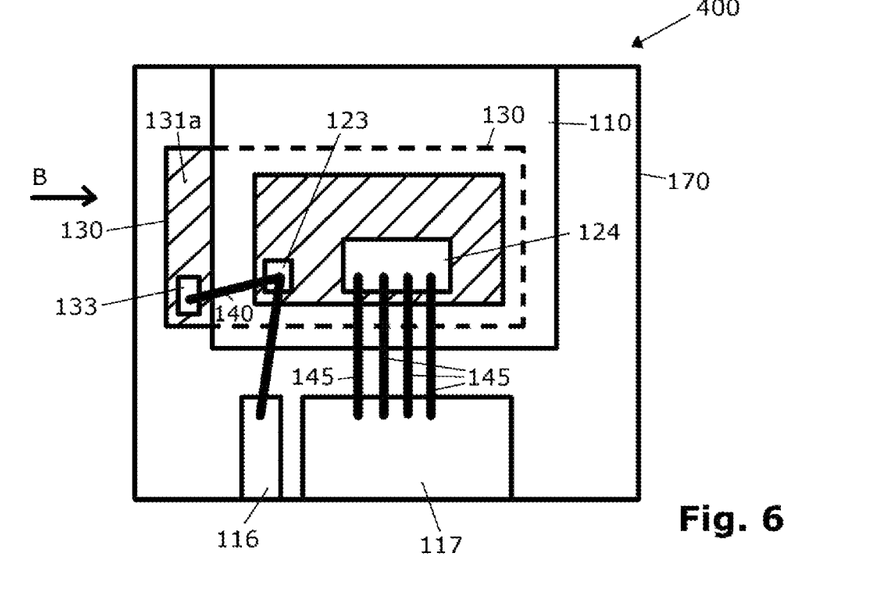
FIG. 6 schematically illustrates a top view of an exemplary semiconductor device including at least two semiconductor chips mounted to opposite sides of a chip carrier.

FIG. 6 illustrates a top view of a semiconductor device package 400. Semiconductor device package 400 is similar to semiconductor device package 300 in terms that the first semiconductor chip 120 may be a power semiconductor chip. However, the first electrode 123 of the first semiconductor chip 120 may be connected by the first electrical conductor 140 to the first electrode 133 of the second semiconductor chip 130. Thus, similar to the design of semiconductor device package 200, the first electrical conductor 140 forms a chip-to-chip interconnect. The voltage at the first electrode 133 of the second semiconductor chip 130 may, e.g., be accessible from the outside of the semiconductor device package 400 via (optional) second terminal pad 116. Again, in view of features which are already described in conjunction with FIGS. 1 to 5, reference is made to the description of the semiconductor device packages 100, 200, 300 in order to avoid reiteration.

Figure 7:
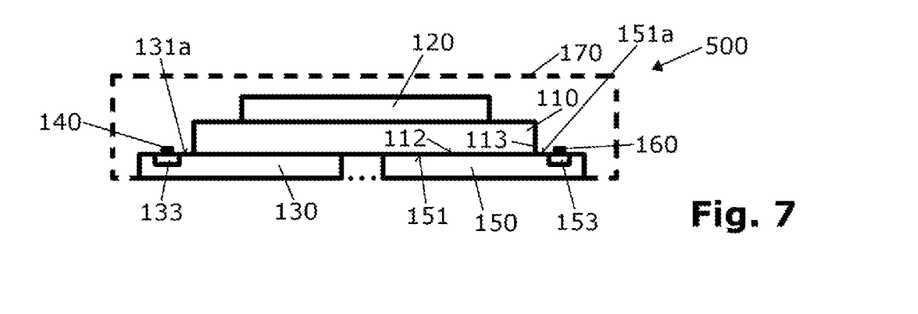
FIG. 7 schematically illustrates a cross-sectional view of an exemplary semiconductor device including at least three semiconductor chips mounted to opposite sides of a chip carrier.

FIGS. 7 to 13 are exemplary illustrations of semiconductor device packages including a third semiconductor chip 150 mounted on the second surface 112 of the chip carrier 110. Semiconductor device package 500 as shown in FIG. 7 comprises a chip carrier 110 having a first chip pad zone mounting the second semiconductor chip 130 and a second chip pad zone mounting the third semiconductor chip 150, wherein the first chip pad zone and the second chip pad zone are contiguous forming a shared chip pad (i.e. the chip carrier 110). That is, the second semiconductor chip 130 and the third semiconductor chip 150 may be mechanically connected to the chip carrier 110 forming one integral chip pad which electrically interconnects the second semiconductor chip 130 and the third semiconductor chip 150.

The third semiconductor chip 150 may be mounted on the second surface 112 of the chip carrier 110 wherein a portion 151a of a first surface 151 of the third semiconductor chip 150, which faces the chip carrier 110, projects over an edge 113 of the chip carrier 110. A second electrical conductor 160 may be coupled to an electrode 153 formed on the projecting portion 151a of the first surface 151 of the third semiconductor chip 150.

It is to be noted that all features described above in view of the second semiconductor chip 130, in particular its location, functionality, electrodes, dimensions, etc., may, e.g., analogously apply to the third semiconductor chip 150. In particular, the above disclosure relating to the second semiconductor chip 130, the first surface 131, the portion 131a, the second surface 132, the first electrode 133 and the first electrical conductor 140 may analogously apply to the third semiconductor chip 150, the first surface 151, the portion 151a, the second surface 152, the first electrode 153 and the first electrical conductor 160, respectively, and reference is made to this description in order to avoid reiteration.

Figure 8:
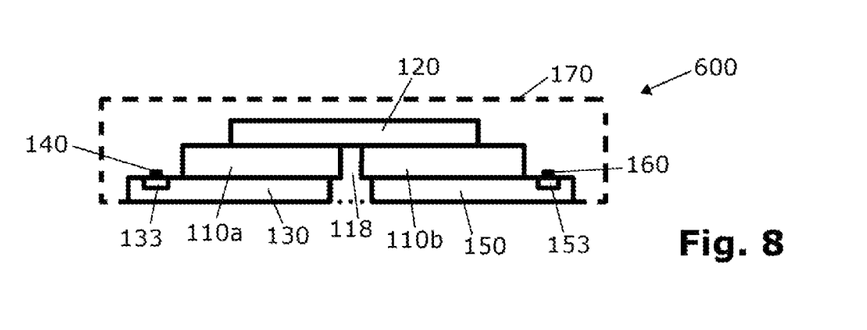
FIG. 8 schematically illustrates a cross-sectional view of an exemplary semiconductor device including at least three semiconductor chips mounted to opposite sides of a chip carrier.

FIG. 8 illustrates a sectional view of an exemplary semiconductor device package 600. The semiconductor device package 600 is similar to the semiconductor device package 500 except that the first chip pad zone and the second chip pad zone, on which the first and second semiconductor chips, respectively, are mounted, are separated by a slit 118 formed between them. That is, the chip carrier 110 may be partitioned in two separate, insular chip pads 110a, 110b, wherein chip pad 110a provides the first chip pad zone for mounting the second semiconductor chip 130 and chip pad 110b provides for the second chip pad zone mounting the third semiconductor chip 150. Apart from this, reference is made to the description of the semiconductor device package 500 as well as the description of semiconductor devices packages 100 to 400 as far as incorporated by reference into the description of semiconductor device package 500.

Figures 9, 10:
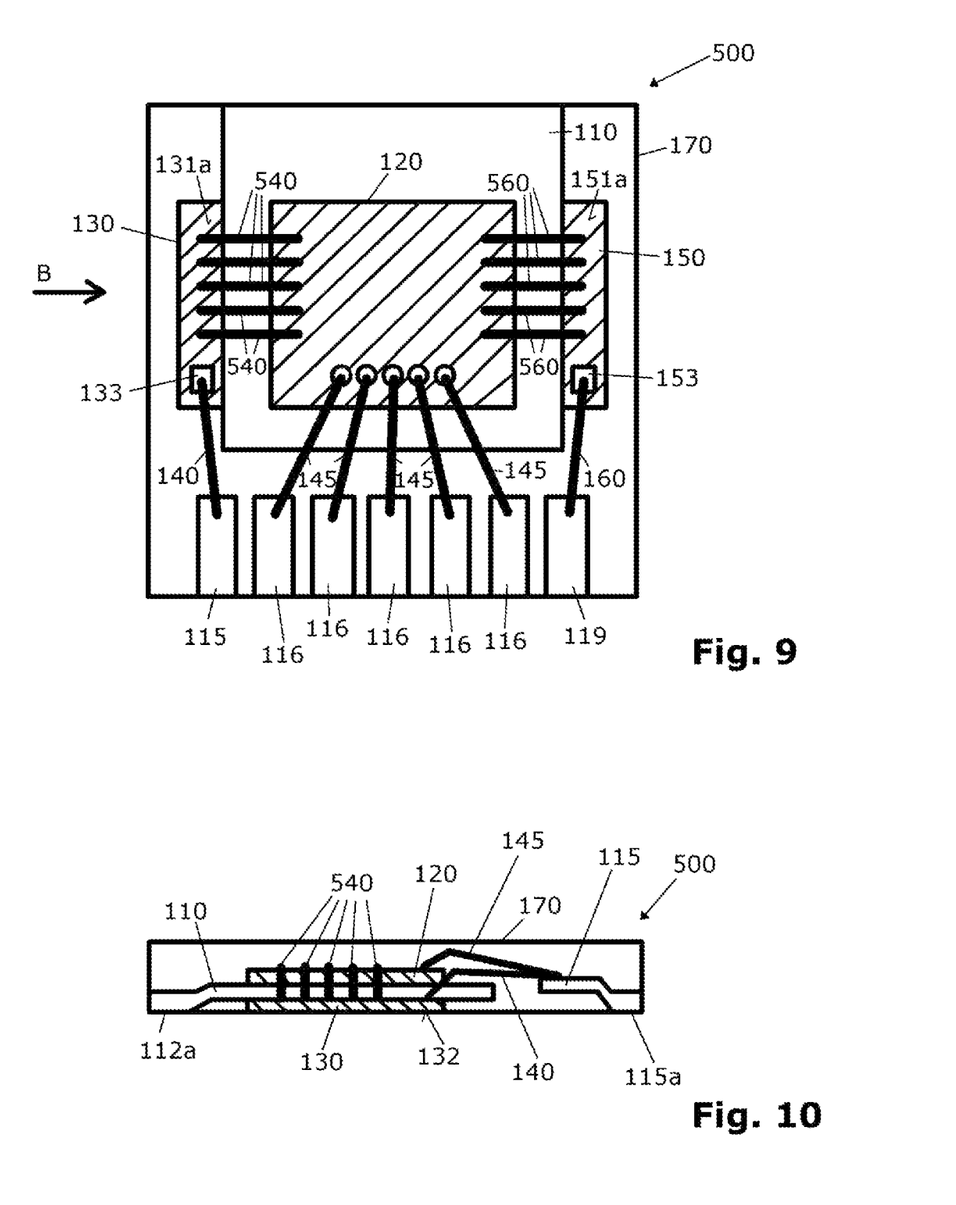
FIG. 9 schematically illustrates a top view of an exemplary semiconductor device including at least three semiconductor chips mounted to opposite sides of a chip carrier.
FIG. 10 schematically illustrates a side view from viewing direction B of FIG. 9 of an exemplary semiconductor device including at least three semiconductor chips mounted to opposite sides of a chip carrier.

Again, it is to be noted that the first semiconductor chip 120 may be a logic or driver chip or may be a semiconductor power chip. Referring to FIG. 9, the first electrode 133 of the second semiconductor chip 130 is connected by the first electrical conductor 140 to first terminal pad 115 and the first electrode 153 of the third semiconductor chip 150 is connected by the second electrical conductor 160 to a fourth terminal pad 119.

In semiconductor device package 500, the first semiconductor chip 120 may, e.g., be a logic or driver chip. By way of example, a plurality of electrical conductors 540 may form chip-to-chip conductors which interconnect, e.g., electrodes of the first semiconductor chip 120 to electrodes of the second semiconductor chip 130. Similarly, electrical conductors 560 may be configured to form chip-to-chip interconnects to couple electrodes of the first semiconductor chip 120 to electrodes of the third semiconductor chip 150. The electrical conductors 540, 560 may, e.g., be BOSB bonding wires.

In semiconductor device package 500, the first semiconductor chip 120 may, e.g., be power semiconductor chip. In this case, the plurality of electrical conductors 540 may form chip-to-chip conductors which interconnect, e.g., a load electrode of the first semiconductor chip 120 to a load electrode of the second semiconductor chip 130. Similarly, electrical conductors 560 may be configured to form chip-to-chip interconnects to couple a load electrode of the first semiconductor chip 120 to a load electrode of the third semiconductor chip 150. Also in this case, the electrical conductors 540, 560 may, e.g., be BOSB bonding wires.

It is to be noted that in package 500, not only the first electrodes 133, 153 (e.g. logic electrodes) are located on the projecting portion 131a of the first surface 131 and the portion 151a of the first surface 151, respectively, but also further electrodes (logic electrodes or load electrodes) of the second and third semiconductor chips 130 and 150, respectively, are located on the respective portions 131a, 151a and are accessible from the top. Thus, by virtue of the projecting portions 131a, 151a of the second and third semiconductor chips 130, 150, respectively, the internal package interconnect (reaching to the first semiconductor chip 120 and/or reaching to the terminal pads 115, 116, 117, 119) is easy to fabricate and a short interconnect length may be obtained. Further, the bottom side of the package may expose load electrodes of the second and third semiconductor chips 130, 150, which may significantly improve heat dissipation/heat removal from the package.

It is to be noted that the first semiconductor chip 120 may also be a combined power semiconductor chip and logic chip. That is, the first semiconductor chip 120 may comprise both power switching circuitry and driver control circuitry.

FIG. 10 illustrates a side view of semiconductor device package 500 from viewing direction B. Reference is made to the description of FIG. 3. Additionally, the electrical conductors 540 coupling the first semiconductor chip 120 to the second semiconductor chip 130 are visible in FIG. 10.

Figure 11:
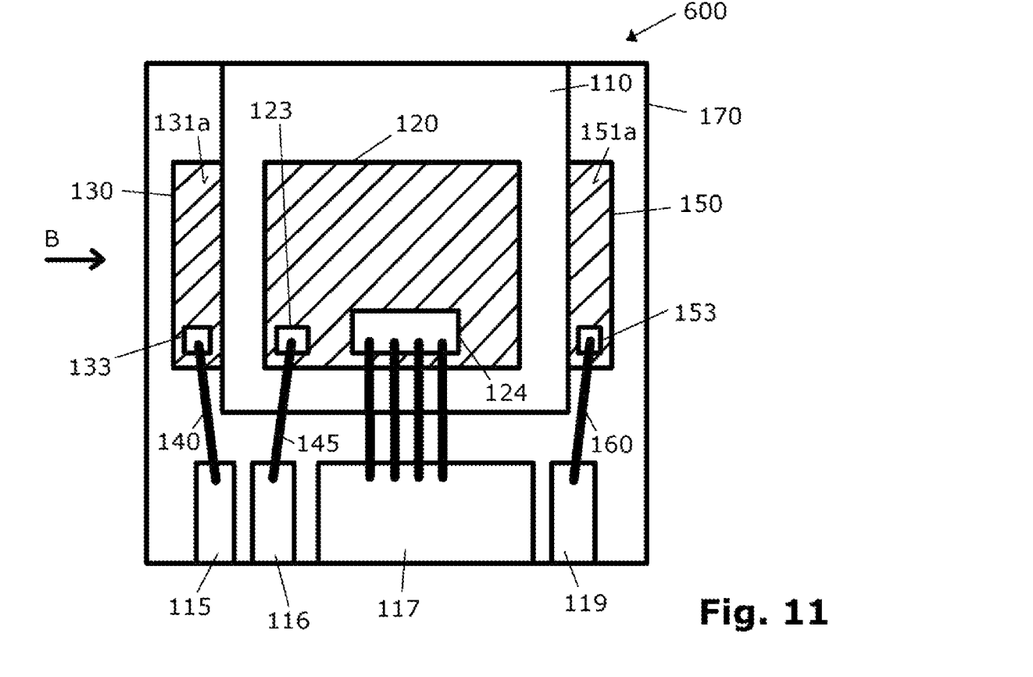
FIG. 11 schematically illustrates a top view of an exemplary semiconductor device including at least three semiconductor chips mounted to opposite sides of a chip carrier.
Figure 12:
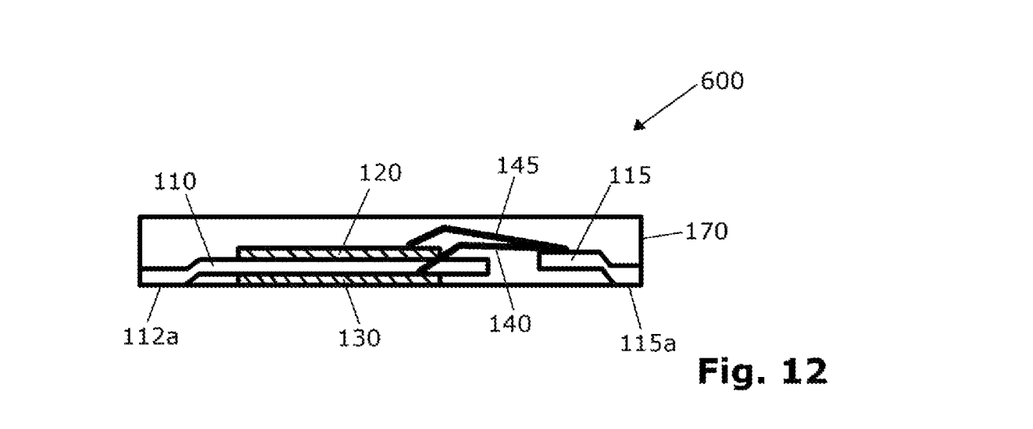
FIG. 12 schematically illustrates a side view from viewing direction B of FIG. 11 of an exemplary semiconductor device including at least three semiconductor chips mounted to opposite sides of a chip carrier.

FIG. 11 illustrates an exemplary semiconductor device package 600. The semiconductor device package 600 is similar to semiconductor device package 500 and reference is made to the description above in order to avoid reiteration. In semiconductor device package 600 the first semiconductor chip 120 is a power semiconductor chip. The first electrode 123 (e.g. control electrode) of the first semiconductor chip 120 is electrically connected to the second terminal pad 116 by an electrical conductor 145 (e.g. bonding wire), and reference is made to semiconductor device packages 300, 400 in this respect. Further, similar to semiconductor device package 500, both first electrodes 133, 153 of the second and third semiconductor chips 130 and 150, respectively, may, e.g., be electrically connected by first and third electrical conductors 140, 160 to first terminal pad 115 and fourth terminal pad 119, respectively. A side view of semiconductor device package 600 from viewing direction B is illustrated in FIG. 12.

Figure 13:
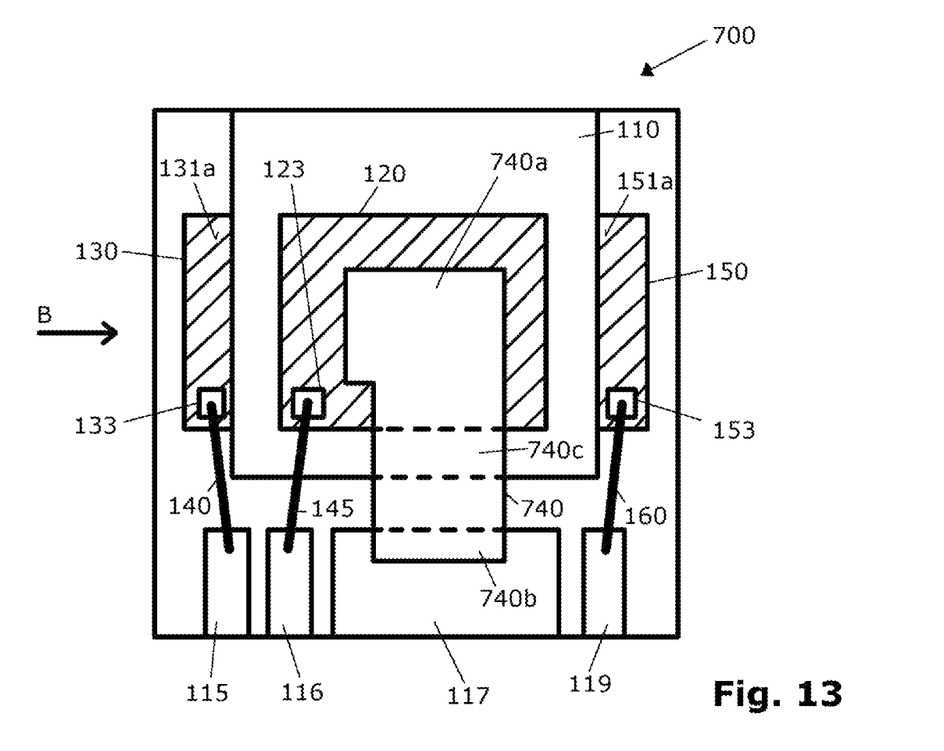
FIG. 13 schematically illustrates a top view of an exemplary semiconductor device including at least three semiconductor chips mounted to opposite sides of a chip carrier.

FIG. 13 illustrates a semiconductor device package 700. Semiconductor device package 700 is similar to semiconductor device package 600 except that a load electrode of the first semiconductor chip 120 is electrically coupled to the third terminal pad 117 by a contact clip 740. The contact clip 740 may be mechanically and electrically connected to the load electrode 124 (not shown in FIG. 13) of the first semiconductor chip 120 and to the third terminal pad 117 of the semiconductor device package 700 by bonding layers (not shown) which may be fabricated by one of the aforementioned materials (e.g. solder, soft solder, diffusion solder, an electrically conducting paste, a nanopaste, a sinter metal material, or an electrically conducting adhesive).

Figure 14:
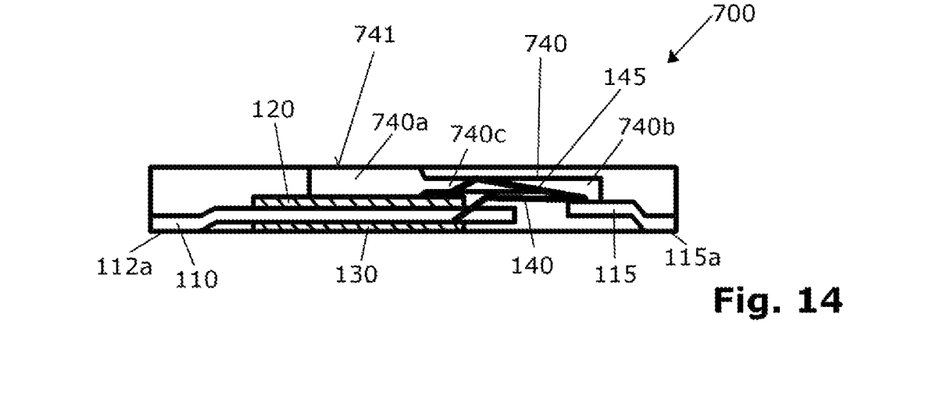
FIG. 14 schematically illustrates a side view from viewing direction B of FIG. 13 of an exemplary semiconductor device including at least three semiconductor chips mounted to opposite sides of a chip carrier.

Referring to FIG. 14 illustrating the semiconductor device package 700 from viewing direction B, the contact clip 740 may comprise a first bonding portion 740a connected to the (upper) load electrode of the first semiconductor chip 120 and a second bonding portion 740b connected to the third terminal pad 117. A bridge portion 740c extending between the bonding portions 740a and 740b may have a thickness (i.e. height in FIG. 14) equal to or greater than, e.g., 100 µm, 200 µm, 300 µm, and 400 µm. The bonding portion 740a may, e.g., be larger in thickness than the bridge portion 740c. The bonding portion 740a may, e.g., comprise an upper surface portion 741 which may be exposed at the top of the semiconductor device package 700. In other words, the upper surface or a part of the upper surface of the contact clip 740 may not be covered by the encapsulant 700. The exposed upper surface portion 741 of the contact clip 740 allows to couple the semiconductor device package 700 to a heat sink arranged adjacent to the top surface of the semiconductor device package 700. Thus, whilst the (bottom) third load electrodes of the second and third semiconductor chips 130, 150 may be directly soldered to an application board for electrical and thermal functions, the upper exposed surface portion 741 may enable good thermal cooling/heat removal performance via a heat sink (not shown) configured to be coupled thereto.

It is to be noted that all of the semiconductor device packages 500, 600, 700 comprising (at least) a second semiconductor chip 130 and a third semiconductor chip 150 arranged beneath the chip carrier 110 may be configured to comprise a chip carrier 110 as depicted in FIG. 8, i.e. having a first chip pad 110a and a second chip pad 110b separated from each other by a slit 118. In this case the second (top) side load electrodes of the second and third semiconductor chips 130, 150 are not electrically interconnected by the chip carrier 110, resulting in that these load electrodes may be set to different electrical potentials.

Further, it is to be noted that features which are described by way of example for the semiconductor device packages 500, 600, 700 having, e.g., at least three semiconductor chips may also be embodied in the semiconductor device packages 100, 200, 300, 400 having two (or more) semiconductor chips. By way of example, the contact clip 740 may also be implemented in semiconductor device packages 300 and/or 400.

Figure 15:
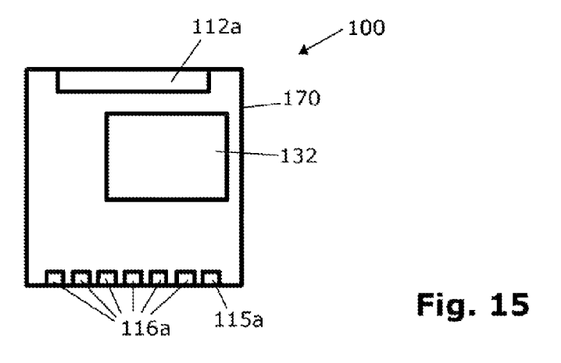
FIG. 15 schematically illustrates a bottom view of an exemplary semiconductor device such as, e.g., illustrated in FIGS. 1, 2 and 3.

According to FIG. 15, a footprint of a semiconductor device package such as, e.g., semiconductor device packages 100 may, e.g., comprise an exposed portion 112a of the second surface 112 of the chip carrier 110, an exposed portion 115a of the lower surface of the first terminal pad 115 and exposed portions 116a of lower surfaces of the second terminal pads 116. The footprint may further comprise an exposed second surface 132 of the second semiconductor chip 130. The footprint shown in FIG. 15 may serve as a mounting surface of the semiconductor device package 100 which may be directly soldered to an application board.

The footprint of FIG. 15 for semiconductor device package 100 is similar to footprints (not shown) of semiconductor device packages 200, 300 or 400 except that in the semiconductor device package 200 footprint, the exposed portion 115a is omitted, in the semiconductor device package 300 footprint, an exposed portion 117a of the lower surface of the third terminal pad 117 is available and in the semiconductor device package 400 footprint, the exposed portion 115a is again omitted. More specifically, the lead configurations shown in FIGS. 4, 5, and 6 may translate into correspondingly exposed footprint portions the same way as the lead configuration shown in FIG. 2 translates into the configuration of exposed footprint portions shown in FIG. 15. In particular in semiconductor device packages 300 and 400, the exposed second surface 132 of the second semiconductor chip 130 may be provided with a load electrode as mentioned above.

Figure 16A:
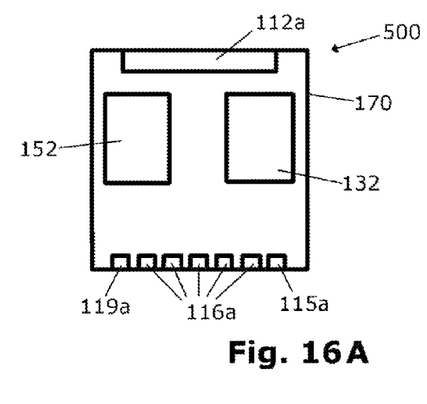
FIG. 16A schematically illustrates a bottom view of an exemplary semiconductor device such as, e.g., illustrated in FIGS. 9 and 10.

According to FIG. 16A, a footprint of a semiconductor device package such as, e.g., semiconductor device package 500 may, e.g., comprise an exposed portion 112a of the second surface 112 of the chip carrier 110, an exposed portion 115a of the lower surface of the first terminal pad 115, an exposed portion 119a of the lower surface of the fourth terminal pad 119 and exposed portions 116a of lower surfaces of the second terminal pads 116. If the chip carrier 110 is split (see FIG. 8) two separate exposed surface portions 112a may be provided. Further, the footprint may comprise exposed second surfaces 132 and 152 of the first and second semiconductor chips 130 and 150, respectively. The footprint shown in FIG. 15 may serve as a mounting surface of the semiconductor device package 500 which may be directly soldered to an application board.

Figure 16B:
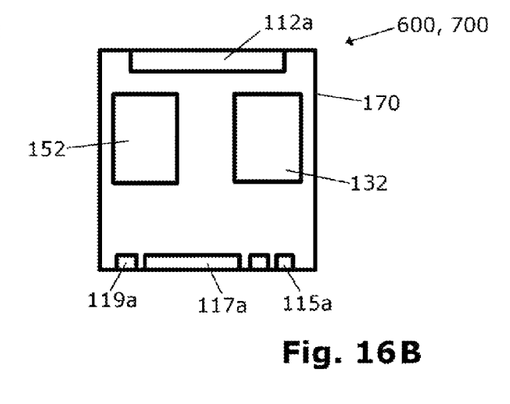
FIG. 16B schematically illustrates a bottom view of exemplary semiconductor devices such as, e.g., illustrated in FIGS. 11 and 12, or 13 and 14.

FIG. 16B is an illustration similar to FIG. 16A except that a footprint of a semiconductor device package such as, e.g., semiconductor device packages 600 or 700 is shown. The footprint may, e.g., exposed second surfaces 132 and 152 of the first and second semiconductor chips 130 and 150, exposed portions 112a, 115a, 119a as mentioned above and, e.g., an exposed portion 117a of the lower surface of the third terminal pad 117.

Figure 17:
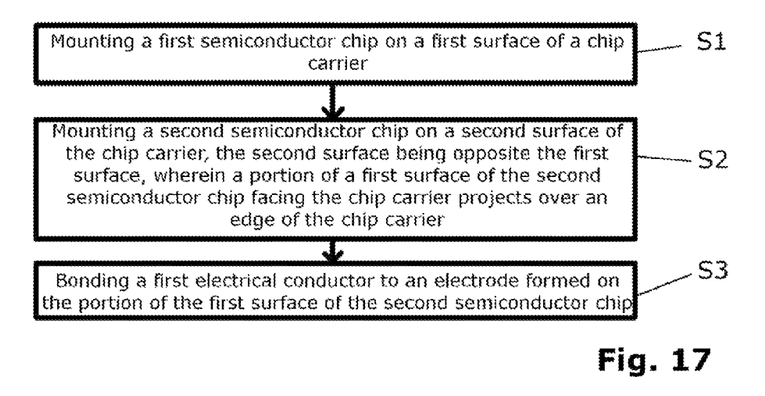
FIG. 17 is a flowchart of an exemplary process for manufacturing a semiconductor device including at least two semiconductor chips mounted to opposite sides of a chip carrier.

FIG. 17 illustrates a flow chart of an exemplary process to manufacture a semiconductor device package as described herein. The process may be applied to all package implementations and package types disclosed herein.

At S1 a first semiconductor chip (e.g. semiconductor chip 120) is mounted on a first surface of a chip carrier (e.g. chip carrier 110).

At S2 a second semiconductor chip (e.g. semiconductor chip 130 and/or semiconductor chip 150) is mounted on a second surface of the chip carrier, wherein the second surface is opposite to the first surface. A portion of a first surface of the second semiconductor chip which faces the chip carrier projects over an edge of the chip carrier.

It is to be noted that S1 may be performed before S2 or S2 may be performed first and then S1 is performed. By way of example, if S2 is performed first, after mounting the second semiconductor chip (and, optionally, also the third semiconductor chip), the chip carrier may be flipped and then the first semiconductor chip may be mounted at S1.

At S3 a first electrical conductor is bonded to an electrode (e.g. electrode 133 or electrode 153) formed on the projecting portion of the first surface of the second semiconductor chip. As already mentioned, bonding of the first electrical conductor can be performed during a process of wire bonding. By way of example, referring e.g. to semiconductor chip package 500, the wire bonds 540 and 560 between the first semiconductor chip 120 and the second and, e.g., third semiconductor chips 130, 150 may be performed with BSOB/security bonds and the wire bonds 140, 145, 160 to terminal pads 115, 116, 119 may be performed by normal wire bonds. Generally speaking, while chip-to-chip bonding may, e.g., use BSOB, chip-to-terminal bonding may, e.g., be performed by normal wire bonding.

Then, after fabricating the internal package interconnect, the encapsulant 700 may be generated. By way of example, the encapsulant 700 may be generated by molding. In particular, a film-assisted molding (FAM) technology may be applied. Film-assisted molding uses one or two plastic films in the mold. The film is inserted into the inner surfaces of the mold before the chip carrier and semiconductor chips mounted thereon are loaded into the mold. Then, a usual molding process such as, e.g., transfer molding may be applied.

Further processes may comprise lead finish and trim, form and singulation. Trim, form and singulation is a method to singulate the package out from an array of packages. Usually, trim and form is used for a leaded package (in which the external terminals project out of the cavity type package) and singulation is used for leadless packages such as, by way of example, are depicted in the various examples shown herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. By way of example, instead of a contact clip it is also possible to use a contact ribbon. This application is intended to cover any adaptations or variations of the specific embodiments discussed herein. Therefore, it is intended that this invention be limited only by the claims and the equivalents thereof.

What is claimed is:

1. A semiconductor device, comprising:
a chip carrier having a first surface and a second surface opposite to the first surface;
a first semiconductor chip mounted on the first surface of the chip carrier;
a second semiconductor chip mounted on the second surface of the chip carrier, wherein a portion of a first surface of the second semiconductor chip which faces the chip carrier projects over an edge of the chip carrier; and
a first electrical conductor coupled to an electrode formed on the portion of the first surface of the second semiconductor chip that projects over the edge of the chip carrier.

2. The semiconductor device of claim 1, wherein the first electrical conductor is further coupled to a first external terminal of the semiconductor device.

3. The semiconductor device of claim 1, wherein the first electrical conductor is further coupled to a first electrode of the first semiconductor chip.

4. The semiconductor device of claim 3, wherein the first semiconductor chip is a logic chip or driver chip and the first electrode of the first semiconductor chip is an input/output electrode or a driver signal electrode.

5. The semiconductor device of claim 3, wherein the first semiconductor chip is a power semiconductor chip and the first electrode of the first semiconductor chip is a control electrode or a load electrode.

6. The semiconductor device of claim 1, further comprising:
an electrical interconnect between a second electrode of the first semiconductor chip and a second external terminal of the semiconductor device.

7. The semiconductor device of claim 6, wherein the first semiconductor chip is a power semiconductor chip and the second electrode of the first semiconductor chip is a load electrode.

8. The semiconductor device of claim 6, wherein the electrical interconnect comprises a bond wire, a contact clip, or a contact ribbon.

9. The semiconductor device of claim 1, wherein the second semiconductor chip is a power semiconductor chip and the electrode formed on the portion of the first surface of the second semiconductor chip that projects over the edge of the chip carrier is a control electrode.

10. The semiconductor device of claim 1, further comprising:
an electrode formed on a second surface of the second semiconductor chip opposite to the first surface of the second semiconductor chip.

11. The semiconductor device of claim 10, further comprising:
an encapsulant embedding the first semiconductor chip and the second semiconductor chip, wherein the electrode formed on the second surface of the second semiconductor chip is exposed by the encapsulant.

12. The semiconductor device of claim 1, further comprising:
a third semiconductor chip mounted on the second surface of the chip carrier, wherein a portion of a first surface of the third semiconductor chip which faces the chip carrier projects over an edge of the chip carrier; and
a second electrical conductor coupled to an electrode formed on the portion of the first surface of the third semiconductor chip that projects over the edge of the chip carrier.

13. The semiconductor device of claim 12, wherein the second electrical conductor is further coupled to a third external terminal of the semiconductor device or to a third electrode of the first semiconductor chip.

14. The semiconductor device of claim 12, wherein the third semiconductor chip is a power semiconductor chip and the electrode formed on the portion of the first surface of the third semiconductor chip that projects over the edge of the chip carrier is a control electrode.

15. The semiconductor device of claim 12, further comprising:
an encapsulant embedding the first semiconductor chip, the second semiconductor chip, and the third semiconductor chip, wherein an electrode formed on a second surface of the third semiconductor chip opposite to the first surface of the third semiconductor chip is exposed by the encapsulant.

16. The semiconductor device of claim 12, wherein the chip carrier comprises a first chip pad zone mounting the second semiconductor chip and a second chip pad zone mounting the third semiconductor chip, wherein the first chip pad zone and the second chip pad zone are contiguous forming a shared chip pad.

17. The semiconductor device of claim 12, wherein the chip carrier comprises a first chip pad zone mounting the second semiconductor chip and a second chip pad zone mounting the third semiconductor chip, wherein the first chip pad zone and the second chip pad zone are arranged having a slit formed between them.

* * * * *